(12) United States Patent
Zimlich et al.

(10) Patent No.: US 9,240,776 B2
(45) Date of Patent: Jan. 19, 2016

(54) ANALOG-DIGITAL PULSE WIDTH MODULATOR (ADPWM)

(71) Applicant: RF Micro Devices, Inc., Greensboro, NC (US)

(72) Inventors: David Zimlich, San Diego, CA (US); Joseph Hubert Colles, Bonsall, CA (US); Ricke W. Clark, Irvine, CA (US); Chris Levesque, Fountain Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 61 days.

(21) Appl. No.: 13/751,480

(22) Filed: Jan. 28, 2013

(65) Prior Publication Data

US 2013/0194051 A1   Aug. 1, 2013

Related U.S. Application Data

(60) Provisional application No. 61/590,911, filed on Jan. 26, 2012, provisional application No. 61/611,249, filed on Mar. 15, 2012.

(51) Int. Cl.
*H03K 3/017* (2006.01)
*H03K 7/08* (2006.01)

(52) U.S. Cl.
CPC .................. *H03K 7/08* (2013.01); *H03K 3/017* (2013.01); *H03C 2200/0045* (2013.01)

(58) Field of Classification Search
CPC ........... H03C 2200/0045; H03K 3/017; H03K 5/04–5/07; H03K 7/08

USPC ............ 318/599; 327/31, 172–177; 332/109, 332/110; 375/238

See application file for complete search history.

(56) References Cited

U.S. PATENT DOCUMENTS

| | | | | |
|---|---|---|---|---|
| 5,428,639 A | * | 6/1995 | Orbach et al. | 375/238 |
| 6,229,358 B1 | * | 5/2001 | Boerstler et al. | 327/116 |
| 6,967,541 B2 | * | 11/2005 | Hooley | 332/109 |
| 7,219,026 B2 | * | 5/2007 | Kim et al. | 702/75 |
| 7,426,123 B2 | * | 9/2008 | Leung et al. | 363/41 |
| 8,218,704 B2 | * | 7/2012 | Kojima | 375/369 |
| 8,723,571 B2 | * | 5/2014 | Felix | 327/159 |
| 2006/0132110 A1 | * | 6/2006 | Tang | 323/282 |

\* cited by examiner

*Primary Examiner* — Levi Gannon
(74) *Attorney, Agent, or Firm* — Withrow & Terranova, P.L.L.C.

(57) ABSTRACT

Analog-to-digital pulse width modulation circuitry includes thermometer code generator circuitry, clock generator circuitry, delay selection circuitry, and an output stage. The thermometer code generator circuitry is adapted to generate a digital thermometer code based upon a received analog input voltage. The clock generator circuitry is adapted to generate a reference clock and a plurality of delayed clock signals. The delay selection circuitry is connected between the thermometer code generator circuitry and the clock generator circuitry, and is adapted to select one of the delayed clock signals to present to the output stage based upon the generated thermometer code. The selected delayed clock signal is delayed by an amount of time that is proportional to the generated thermometer code. The reference clock signal and the selected delayed clock signal are delivered to the output stage where they are used to generate a pulse width modulated output signal.

19 Claims, 8 Drawing Sheets

ANALOG-DIGITAL PULSE WIDTH MODULATOR (ADPWM)

RELATED APPLICATIONS

This application claims the benefit of provisional patent application Ser. No. 61/590,911, filed Jan. 26, 2012 and 61/611,249, filed Mar. 15, 2012, the disclosures of which are hereby incorporated by reference in their entirety.

FIELD OF THE DISCLOSURE

The present disclosure relates generally to pulse width modulation, and in particular to high-efficiency, low cost, and small size analog-to-digital pulse width modulation circuitry.

BACKGROUND OF THE DISCLOSURE

Pulse width modulation (PWM) is the modulation of the duty cycle of a rectangular pulse signal. Pulse width modulation circuitry may be adapted to generate a rectangular pulse output signal with a duty cycle that is controlled by an analog input voltage. This PWM circuitry has numerous applications in modern electronic devices, including power regulation and RF communications. Multiple configurations for PWM circuitry currently exist, including both analog and analog-to-digital designs.

Figure 1:
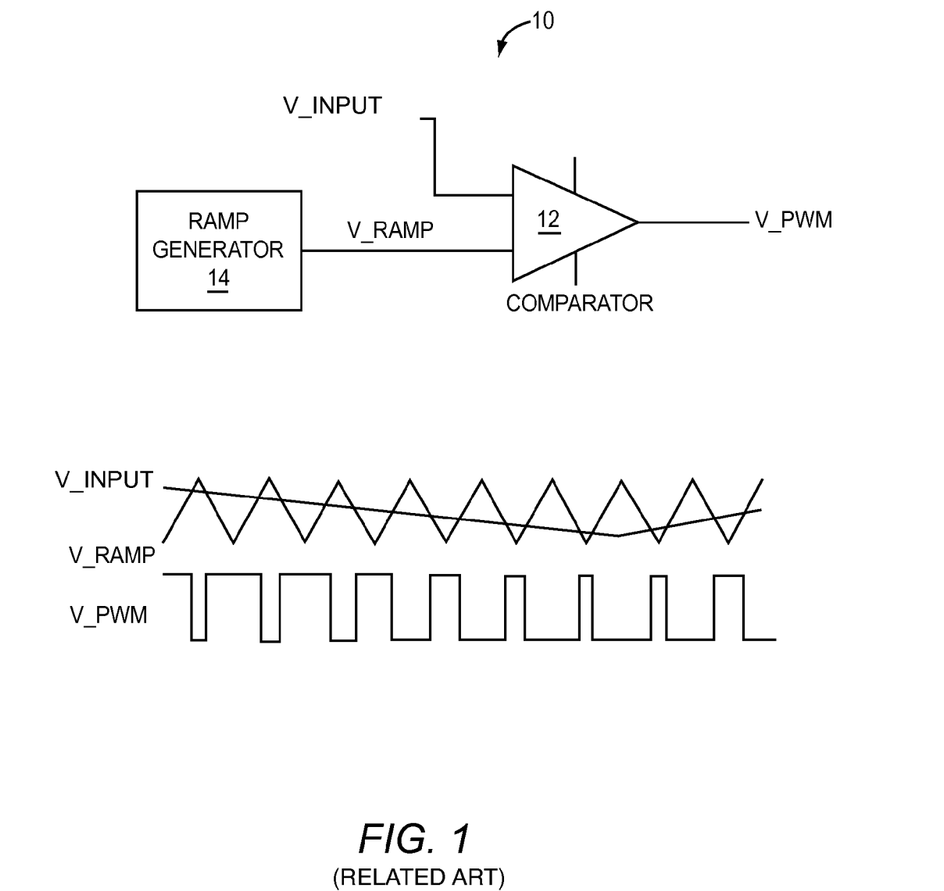
FIG. 1 is a schematic representation of conventional analog pulse width modulation circuitry.

One example of conventional PWM circuitry is shown in FIG. 1. FIG. 1 shows conventional analog PWM circuitry 10 including a comparator 12 and a ramp generator 14. The ramp generator 14 is adapted to generate a ramp signal V_RAMP. The comparator 12 is adapted to receive the ramp signal V_RAMP and an analog input voltage V_INPUT from an external source (not shown). The comparator 12 is further adapted to compare the ramp signal V_RAMP and the analog input voltage V_INPUT to produce a rectangular pulse output signal V_PWM. As is shown in the timing diagram, the rectangular pulse output signal V_PWM is at a logic-level high when then analog input voltage V_INPUT is greater than the ramp signal V_RAMP, and at a logic-level low when the analog input voltage V_INPUT is less than the ramp signal V_RAMP. Accordingly, the conventional analog PWM circuitry 10 generates the rectangular pulse output signal V_PWM with a modulated duty cycle that is controlled by the analog input voltage V_INPUT.

Although suitable for some PWM applications, the conventional analog pulse width modulation circuitry 10 suffers from low efficiency, high noise, and marginal reliability. The ramp generator 14 consumes a large amount of power, especially at high frequencies. Further, the ramp generator 14 is susceptible to noise of surrounding circuitry.

Figure 2:
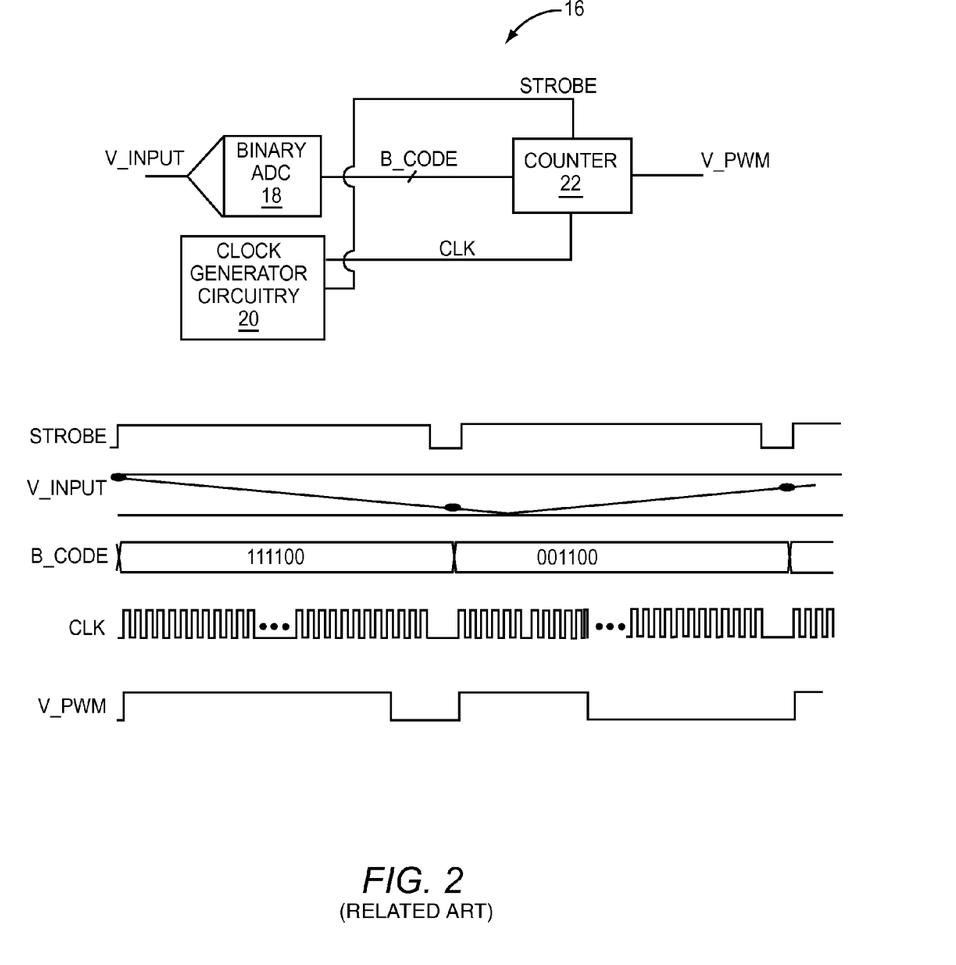
FIG. 2 is a schematic representation of conventional analog-to-digital pulse width modulation circuitry.

An additional example of conventional PWM circuitry is shown in FIG. 2. FIG. 2 shows conventional analog-to-digital PWM circuitry 16, including a binary analog-to-digital converter 18, clock generator circuitry 20, and a counter 22. The binary analog-to-digital converter 18 is adapted to receive an analog input voltage V_INPUT and produce a binary coded digital value B_CODE that is representative of the amplitude of the analog input voltage V_INPUT. The clock generator circuitry 20 is adapted to generate a clock signal CLK and a strobe control signal STROBE for driving the counter 22. When the strobe control signal STROBE experiences a rising edge, the counter 22 generates a voltage at the output of the conventional analog-to-digital PWM circuitry 16, corresponding with a logic-level high signal, as is shown in the timing diagram. The counter 22 then counts each clock cycle of the clock signal CLK and continues to generate a voltage at the output until a number of clock cycles determined by the binary coded digital value B_CODE have passed. Once the correct number of clock cycles have passed, the counter 22 ceases to generate a voltage at the output of the conventional analog-to-digital PWM circuitry 16, corresponding with a logic-level low signal, as is shown in the timing diagram. Accordingly, the conventional analog-to-digital PWM circuitry 16 generates a rectangular pulse output signal V_PWM with a modulated duty cycle that is controlled by the analog input voltage V_INPUT.

Although suitable for some PWM applications, the conventional analog-to-digital PWM circuitry 16 may be expensive or impractical to operate at high frequencies. At high operating frequencies, the counter 22 must operate at a very high speed in order to effectively count each clock cycle. A high speed counter may increase the cost of the conventional analog-to-digital PWM circuitry 16, and may consume large amounts of power. Further, due to the binary encoding of the analog input voltage V_INPUT, the conventional analog-to-digital PWM circuitry 16 is highly sensitive to errors. Because of the weighted nature of binary encoding, an error in a single bit of the binary coded digital value B_CODE has the potential to produce up to a 50% margin of error in the pulse width of the rectangular pulse output signal V_PWM. This is known as a "most significant bit" error, and is problematic for many applications that demand precise control over the rectangular pulse output signal V_PWM.

Figure 3:
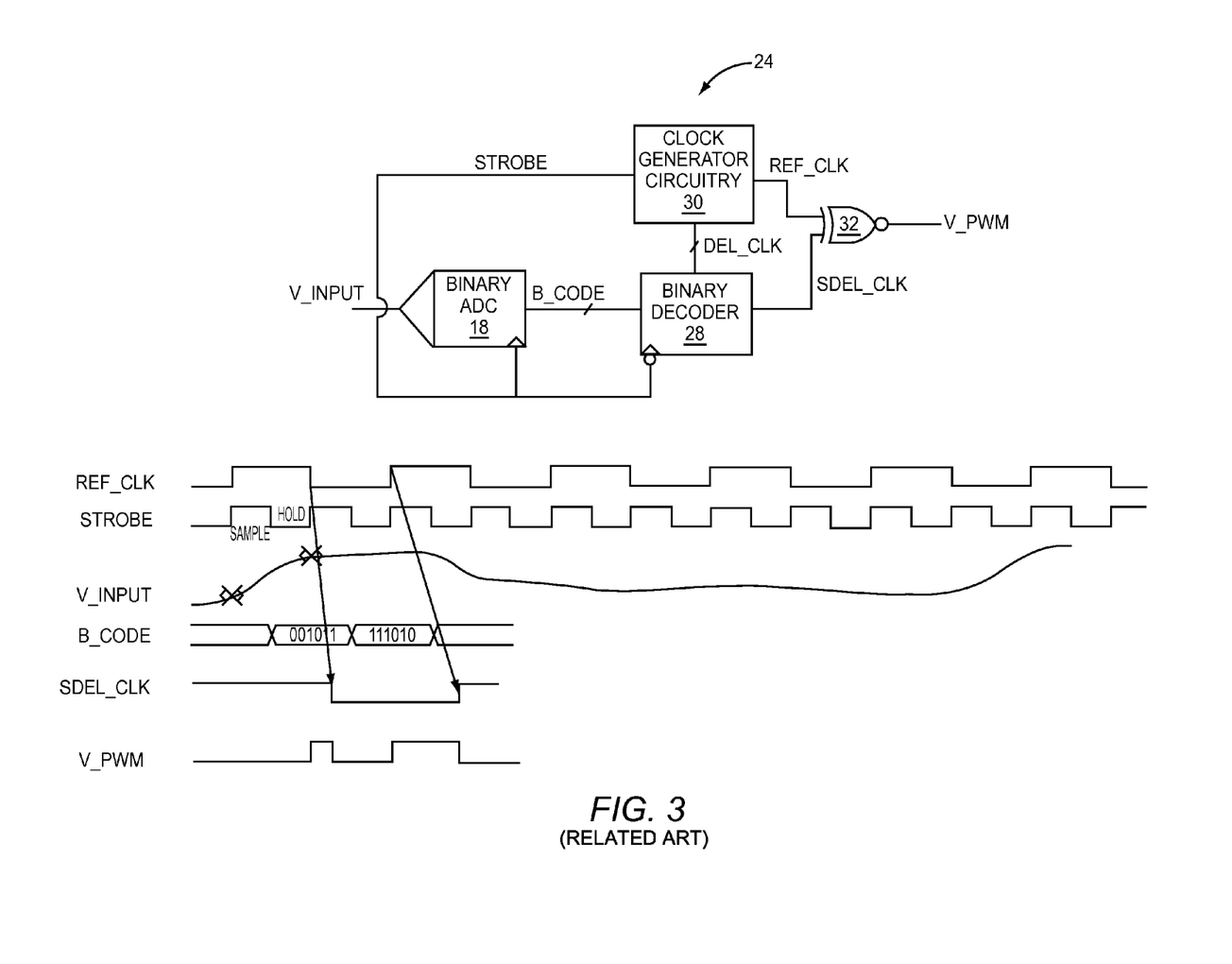
FIG. 3 is a schematic representation of conventional analog-to-digital pulse width modulation circuitry.

An additional example of conventional PWM circuitry is shown in FIG. 3. FIG. 3 shows conventional analog-to-digital PWM circuitry 24 including a binary analog-to-digital converter 26, a binary decoder 28, clock generator circuitry 30, and an output stage 32. The binary analog-to-digital converter 26 is adapted to receive an analog input voltage V_INPUT and produce a binary coded digital value B_CODE that is representative of the amplitude of the analog input voltage V_INPUT. The clock generator circuitry 30 is adapted to generate a reference clock signal REF_CLK and a plurality of delayed clock signals DEL_CLKS for presentation to the binary decoder 28. The binary decoder 28 is adapted to receive and decode the binary coded digital value B_CODE, and select a delayed clock signal SDEL_CLK from the plurality of delayed clock signals DEL_CLKS based upon the decoded binary coded digital value B_CODE. The selected delayed clock signal SDEL_CLK is delivered to the output stage 32, where it is used in combination with the reference clock signal REF_CLK to generate a rectangular pulse output signal V_PWM with a modulated duty cycle that is controlled by the analog input voltage V_INPUT.

Although suitable for some PWM applications, the conventional analog-to-digital PWM circuitry 24 suffers from latency errors introduced as a result of the binary encoding and decoding of the analog input voltage V_INPUT.

Because both the binary analog-to-digital converter 26 and the binary decoder 28 take at least one clock cycle to generate their respective output signals, the rectangular pulse output signal V_PWM will be delayed by at least one clock cycle with respect to changes in the analog input voltage V_INPUT. This error is often referred to as a "Z-1 error," and is difficult to correct. In applications where timing is crucial to the operation of the device, the described error may render the device inoperable or unstable. Further, due to the binary encoding and decoding of the analog input voltage V_INPUT, the conventional analog-to-digital PWM circuitry 24 suffers from the same error sensitivity as described above with respect to FIG. 2. Accordingly, there is a need for PWM circuitry that is efficient and noise-immune while avoiding latency errors.

SUMMARY OF THE DISCLOSURE

An analog-to-digital pulse width modulator includes thermometer code generator circuitry, clock generator circuitry, delay selection circuitry, and an output stage. The thermometer code generator circuitry is adapted to generate a digital thermometer code based upon a received analog input voltage. The clock generator circuitry is adapted to generate a reference clock signal and a plurality of delayed clock signals. The delay selection circuitry is connected between the thermometer code generator circuitry and the clock generator circuitry, and is adapted to select one of the delayed clock signals to present to the output stage based upon the generated thermometer code. The selected delayed clock signal is delayed by an amount of time that is proportional to the generated thermometer code. The reference clock signal and the selected delayed clock signal are delivered to the output stage where they are used to generate a digital output signal with a duty cycle that is proportional to the analog input voltage.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this Specification and the relevant art and will not be interpreted in an idealized or overly formal sense unless expressly so defined herein.

Figure 4:
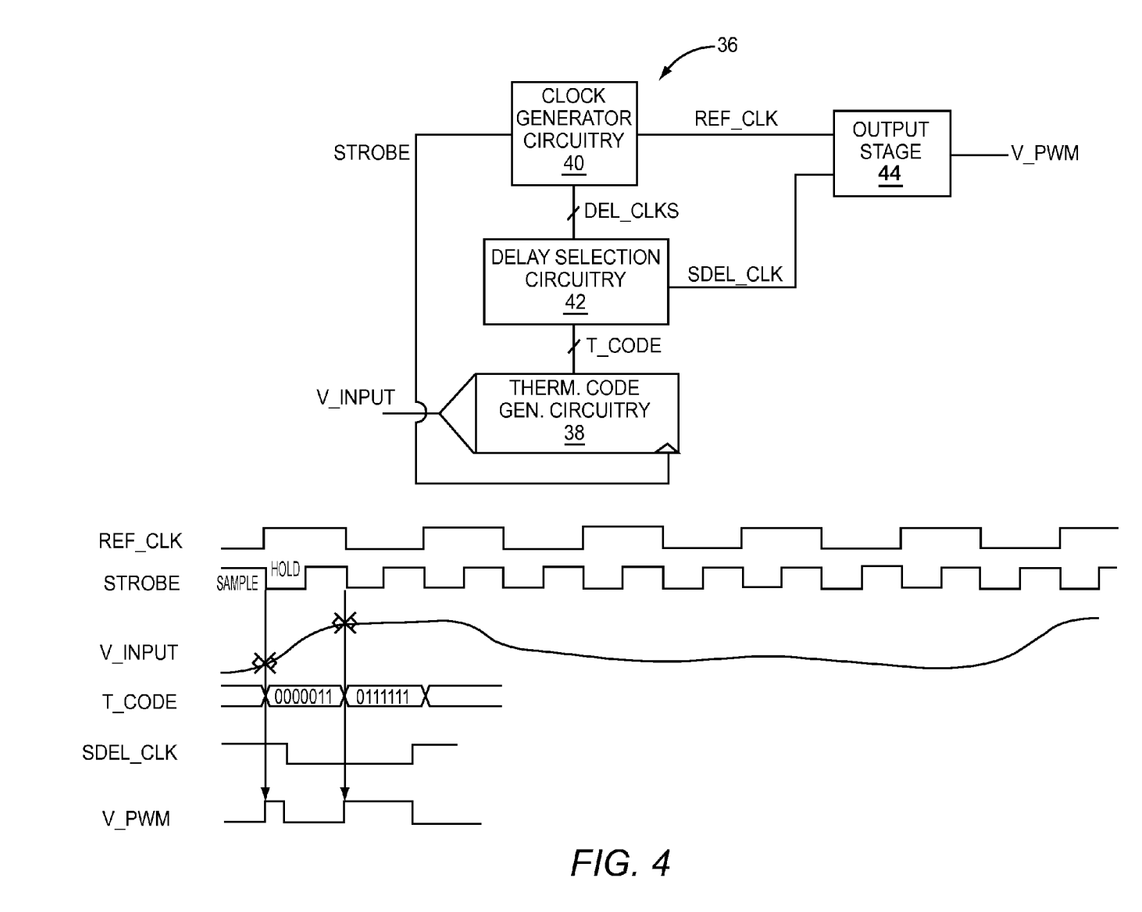
FIG. 4 is a schematic representation of analog-to-digital pulse width modulation circuitry according to the present disclosure.

Turning now to FIG. 4, a first embodiment of analog-to-digital pulse width modulation circuitry 36 is shown according to the present disclosure. The analog-to-digital pulse width modulation circuitry 36 includes thermometer code generator circuitry 38, clock generator circuitry 40, delay selection circuitry 42, and an output stage 44. The thermometer code generator circuitry 38 is adapted to generate a digital thermometer code T_CODE based upon the amplitude of a received analog input voltage V_INPUT. The clock generator circuitry 40 is adapted to generate a reference clock signal REF_CLK, which is delivered to the output stage 44, a plurality of delayed clock signals DEL_CLKS for presentation to the delay selection circuitry 42, and a strobe control signal STROBE for driving the thermometer code generator circuitry 38. The delay selection circuitry 42 is adapted to select a delayed clock signal SDEL_CLK from the plurality of delayed clock signals DEL_CLKS based upon the digital thermometer code T_CODE, and present the selected delayed clock signal SDEL_CLK to the output stage 44. The output stage 44 is adapted to generate a rectangular pulse output signal V_PWM based upon the received reference clock signal REF_CLK and the selected delayed clock signal SDEL_CLK. As is shown in the timing diagram, the delay of the selected delayed clock signal SDEL_CLK determines the width of the pulse in the rectangular pulse output signal V_PWM. Accordingly, because the digital thermometer code T_CODE is generated based on the analog input voltage V_INPUT, the modulation of the duty cycle of the rectangular pulse output signal V_PWM is controlled by the analog input voltage V_INPUT.

By using the digital thermometer code T_CODE to select the delayed clock signal SDEL_CLK, the duty cycle of the rectangular pulse output signal V_PWM is updated approximately instantaneously. Further, due to the un-weighted nature of the thermometer encoding, errors in one or more bits of the digital thermometer code T_CODE have a minimal impact on the margin of error of the rectangular pulse output signal V_PWM.

According to one embodiment of the present disclosure, the thermometer code generator circuitry 38 is adapted to generate a digital thermometer code T_CODE based upon a received digital input signal V_INPUT. Accordingly, the thermometer code generator circuitry 38 may comprise one or more digital signal processors (DSPs), microprocessors, or the like.

According to an additional embodiment of the present disclosure, the analog-to-digital pulse width modulation circuitry 36 is integrated onto a single semiconductor die to form an analog-to-digital pulse width modulation die. Due to the architecture of the analog-to-digital pulse width modulation circuitry 36, noise on the analog-to-digital pulse width modulation die is minimized. Accordingly, more than one set of analog-to-digital pulse width modulation circuitry 36 may be integrated onto the analog-to-digital pulse width modulation die without significantly degrading the performance of the analog-to-digital pulse width modulation circuitry 36. The analog-to-digital pulse width modulation die may include two or more analog input terminals, or a single digital input bus in order to direct input signals to the one or more sets of analog-to-digital pulse width modulation circuitry 36. Incoming digital signals from the digital input bus may be multiplexed and directed to the appropriate analog-to-digital pulse width modulation circuitry 36 within the analog-to-digital pulse width modulation die.

Figure 5:
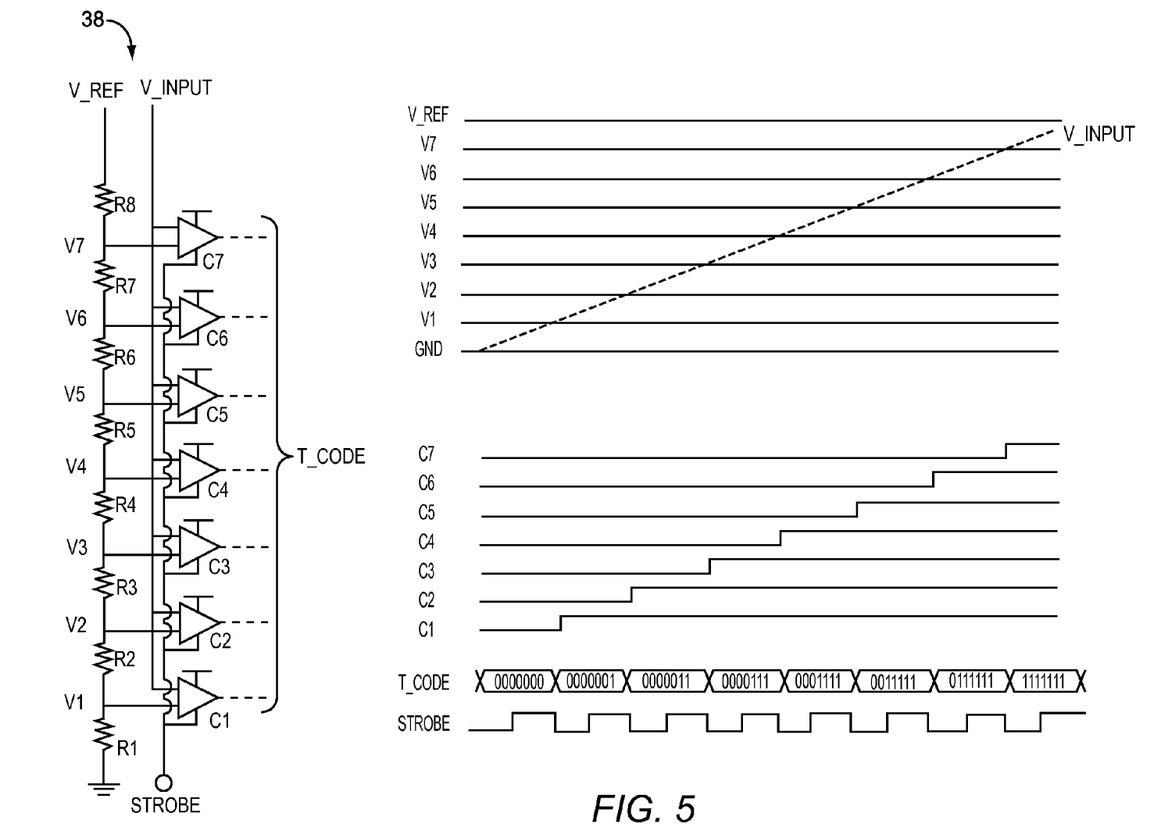
FIG. 5 is a detailed schematic representation of thermometer code generator circuitry according to one embodiment of the present disclosure.

FIG. 5 is a detailed schematic representation of the thermometer code generator circuitry 38 according to one embodiment of the present disclosure. The thermometer code generator circuitry 38 includes a plurality of resistors R1-R8 coupled in series between ground and a reference voltage V_REF, as well as a plurality of comparators C1-C7. The plurality of resistors R1-R8 divide the reference voltage V_REF into a plurality of discrete voltage levels V1-V7. Each one of the discrete voltage levels V1-V7 is delivered to a different one of the plurality of comparators C1-C7. Each one of the plurality of comparators C1-C7 is adapted to compare the received discrete voltage level to an analog input voltage V_INPUT. If the analog input voltage V_INPUT is greater than the discrete voltage level presented to the comparator, a logic-level high is placed on the output terminal of the comparator. If the analog input voltage V_INPUT is less than the discrete voltage level presented to the comparator, a logic-level low is placed on the output terminal of the comparator. The output terminals of the plurality of comparators C1-C7 represent the digital thermometer code T_CODE associated with the analog input voltage V_INPUT, such that the most significant bit (MSB) is represented by the output of the last comparator C7 and the least significant bit (LSB) is represented by the output of the first comparator C1.

The timing diagram included in FIG. 5 shows the digital thermometer code T_CODE as the analog input voltage V_INPUT increases. As is shown in the timing diagram, as the analog input voltage V_INPUT increases to become greater than each one of the plurality of discrete voltage levels V1-V7, the comparator associated with the discrete voltage level produces a logic-level high signal at the output. Accordingly, the digital thermometer code T_CODE is produced as shown.

According to some embodiments of the present disclosure, the plurality of comparators C1-C7 are latching comparators. Accordingly, each one of the plurality of comparators C1-C7 is driven by a digital clock signal, such as the provided strobe control signal STROBE. The plurality of comparators C1-C7 may be adapted to sample an input voltage while the strobe control signal STROBE is at a logic-level high, and hold the measurement while the strobe control signal STROBE is at a logic-level low. The strobe control signal STROBE may be generated by the clock generator circuitry 40 to allow the plurality of comparators C1-C7 sufficient time to settle between sampling times in order to avoid encoding errors.

Figure 6:
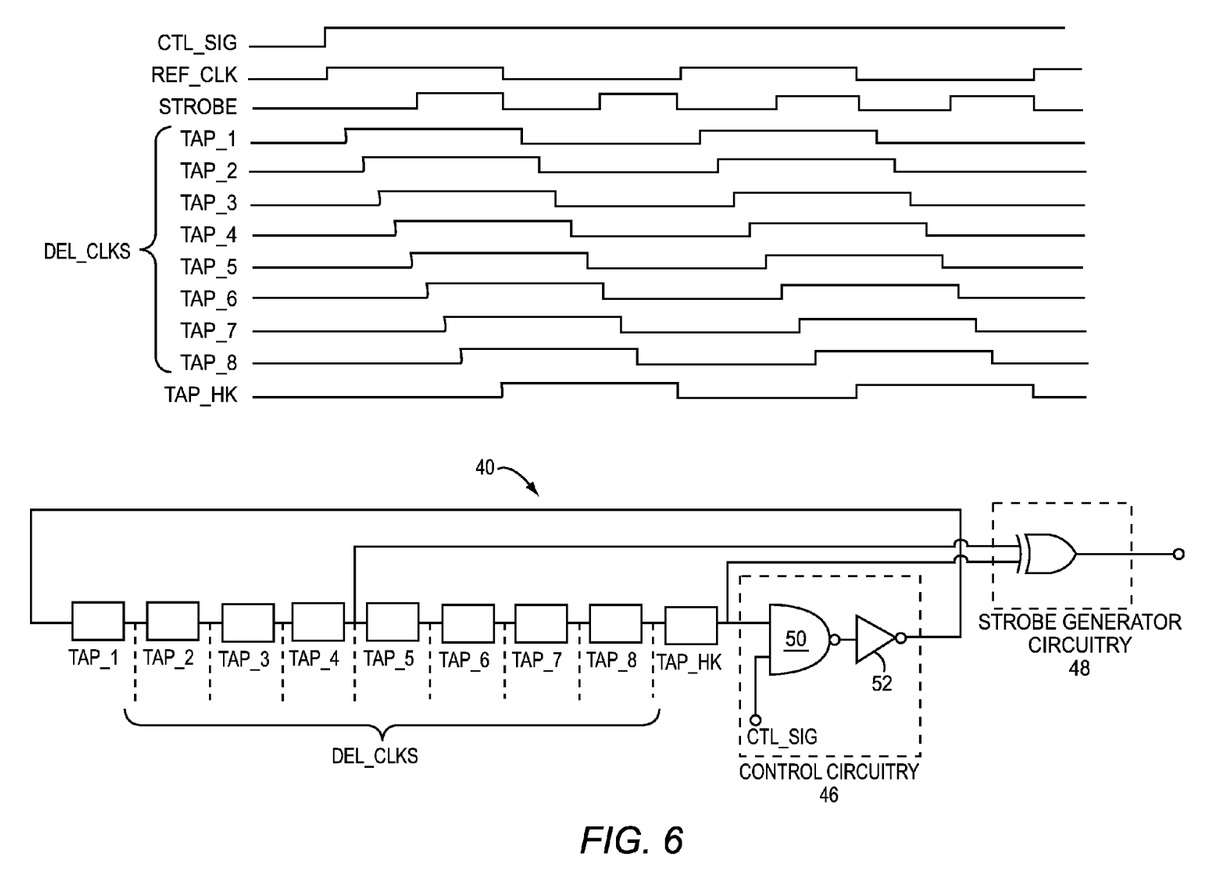
FIG. 6 is a detailed schematic representation of clock generator circuitry according to one embodiment of the present disclosure.

FIG. 6 is a detailed schematic representation of the clock generator circuitry 40 according to one embodiment of the present disclosure. According to this embodiment, the clock generator circuitry 40 is a ring oscillator including control circuitry 46, strobe generator circuitry 48, and a plurality of delay taps TAP_1-TAP_HK. The control circuitry 46 is coupled between the plurality of delay taps TAP_1-TAP_HK, which are connected in series, such that the input of the control circuitry 46 is connected to the output of the housekeeping delay tap TAP_HK and the output of the control circuitry 46 is connected to the input of the first delay tap TAP_1 to form a loop. The control circuitry 46 includes a control logic gate 50 having a first input terminal, a second input terminal, and an output terminal coupled in series to an inverter 52, such that the output of the control logic gate 50 is connected to the input of the inverter 52. The first input terminal of the control logic gate 50 is coupled to the output of the plurality of delay taps TAP_1-TAP_HK. The second input terminal of the control logic gate 50 is adapted to receive a control signal CTL_SIG, which may be generated internally by the clock generator circuitry 40 or provided by an external source (not shown). The strobe generator circuitry 48 is coupled at the output of the fourth delay tap TAP_4 and the housekeeping delay tap TAP_HK.

The control circuitry 46 is adapted to start or stop operation of the clock generator circuitry 40 based on the control signal CTL_SIG. When the control signal CTL_SIG is kept at a logic-level low, the reference clock signal REF_CLK remains at a constant voltage and the clock generator circuitry 40 does not produce a reference clock signal REF_CLK. To begin operation of the clock generator circuitry 40, the control signal CTL_SIG is brought to a logic-level high. The control signal CTL_SIG is placed on the second input terminal of the control logic gate 50 and compared to the output of the housekeeping delay TAP_HK. According to one embodiment, the control logic gate 50 is a CMOS "n and" gate. Accordingly, because the control signal CTL_SIG is at a logic-level high and the output of the housekeeping delay tap TAP_HK is at a logic level low, the control logic gate 50 will produce a logic-level low signal at the output. The inverter 52 inverts the output of the control logic gate 50 to produce a logic-level high signal, thereby producing a rising edge in the reference clock signal REF_CLK. The reference clock signal REF_CLK is delivered to the plurality of delay taps TAP_1-TAP_HK.

Each one of the plurality of delay taps TAP_1-TAP_HK delay the propagation of the reference clock signal REF_CLK through the clock generator circuitry 40 in order to produce a plurality of delayed clock signals DEL_CLKS. The housekeeping delay tap TAP_HK is provided to give the analog-to-digital pulse width modulation circuitry 36 time to settle between generated pulses, as well as to maintain a minimum and maximum pulse width at the output of the circuitry. Each one of the plurality of delay taps TAP_1-TAP_HK may comprise, for example, an even number of NMOS, PMOS, or CMOS inverters.

When the rising edge of the reference clock signal REF_CLK propagates to the output of the housekeeping delay tap TAP_HK, a logic-level high signal is presented to the logic control gate 50 along with the control signal CTL_SIG. Accordingly, because both the output of the housekeeping delay tap TAP_HK and the control signal CTL_SIG are at a logic-level high, a logic-level high signal is produced at the output of the control logic gate 50, which is inverted by the inverter 52 to create a falling edge in the reference clock signal REF_CLK. The above process is repeated while the control signal CTL_SIG is maintained at a logic-level high in order to produce the reference clock signal REF_CLK and the plurality of delayed clock signals DEL_CLKS.

The strobe generator circuitry includes a strobe generator logic gate 54 in communication with the fourth delay tap TAP_4 and the housekeeping delay tap TAP_HK. According to one embodiment, the strobe generator logic gate 54 may be a CMOS "exclusive-or" gate. By combining the output of the fourth delay tap TAP_4 and the housekeeping delay tap TAP_HK with the strobe generator logic gate 54, a strobe control signal STROBE is produced that has approximately double the frequency of the reference clock signal REF_CLK. Accordingly, the strobe control signal STROBE is suitable for driving the plurality of comparators C1-C7 of the thermometer code generator circuitry 38 shown in FIGS. 4 and 5, as it will provide adequate sampling and settling time in order to avoid encoding errors. Although the present embodiment shows the strobe generator circuitry 48 in communication with the fourth delay tap TAP_4 and the housekeeping delay tap TAP_HK, any combination of delay taps combined in any manner may be used to produce the strobe control signal STROBE such that the plurality of comparators C1-C7 of the thermometer code generator circuitry 38 shown in FIGS. 4 and 5 are given adequate time to settle between sampling times in order to avoid encoding errors.

The timing diagram of FIG. 6 shows the operation of the clock generator circuitry 40 according to one embodiment of the present disclosure. As discussed above, when the control signal CTL_SIG is switched to a logic-level high, the reference clock signal REF_CLK experiences a rising edge. The reference clock signal REF_CLK then propagates through the clock generator circuitry 40, where it is delayed by each one of the plurality of delay taps TAP_1-TAP_HK. When the clock signal propagates back to the control circuitry 46, it is used to generate a falling edge in the reference clock signal REF_CLK. This process is repeated while the control signal CTL_SIG is maintained at a logic-level high in order to produce the reference clock signal REF_CLK and the plurality of delayed clock signals DEL_CLKS. The strobe control signal STROBE is generated with twice the frequency of the reference clock signal REF_CLK in order to give the comparators C1-C7 of the thermometer code generator circuitry 38 shown in FIGS. 4 and 5 adequate time to settle between sampling times in order to avoid encoding errors.

Figure 7:
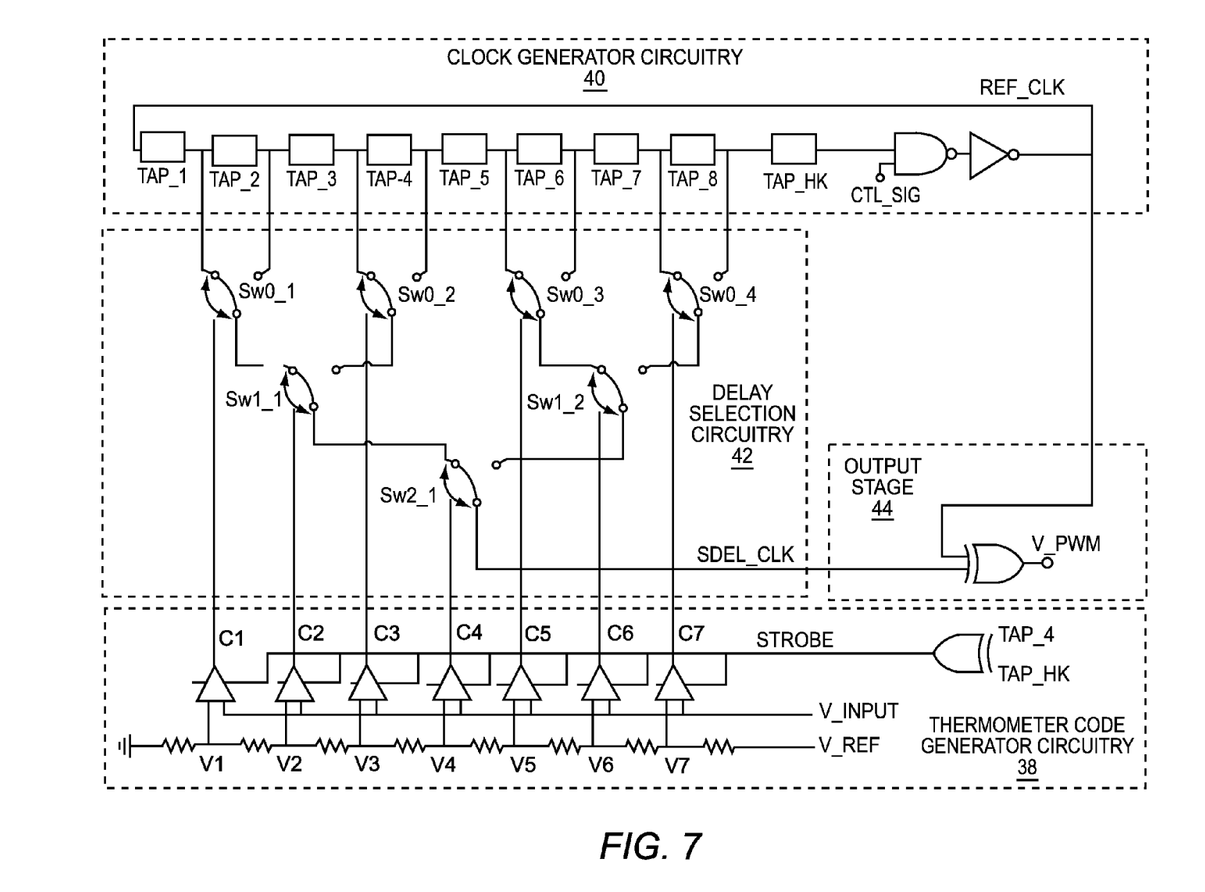
FIG. 7 is a detailed schematic representation of analog-to-digital pulse width modulation circuitry according to one embodiment of the present disclosure.

FIG. 7 is a detailed schematic representation of the analog-to-digital pulse width modulation circuitry 36 according to one embodiment of the present disclosure. Although the analog-to-digital pulse width modulation circuitry 36 shown in FIG. 7 has a resolution of three bits, the techniques of the present disclosure may be used to produce analog-to-digital pulse width modulation circuitry of any resolution. The analog-to-digital pulse width modulation circuitry 36 includes the thermometer code generator circuitry 38, the clock generator circuitry 40, the delay selection circuitry 42, and the output stage 44. As discussed above, the thermometer code generator circuitry 38 generates a digital thermometer code T_CODE based upon a received analog input voltage V_INPUT. The clock generator circuitry 40 generates a reference clock signal REF_CLK, which is delivered to the output stage 44, a plurality of delayed clock signals DEL_CLKS for presentation to the delay selection circuitry 42, and a strobe control signal STROBE for driving the thermometer code generator circuitry 38. The delay selection circuitry 42 is connected between the clock generator circuitry 40 and the thermometer code generator circuitry 38. The delay selection circuitry 42 uses the digital thermometer code T_CODE to select a delayed clock signal SDEL_CLK to present to the output stage 44. The output stage 44 generates a rectangular pulse output signal V_PWM based upon the received reference clock signal REF_CLK and the selected delayed clock signal SDEL_CLK.

The delay selection circuitry 42 comprises a switch array SW0_1-SW2_1 coupled between the clock generator circuitry 40 and the thermometer code generator circuitry 38. Each one of the switches in the switch array SW0_1-SW2_1 includes a first input terminal, a second input terminal, an output terminal, and a control selection terminal. The control selection terminal of each switch is adapted to select one of the first input terminal or the second input terminal to connect to the output terminal based on an applied input selection signal. If the input selection signal is a logic-level high, the second input terminal is connected to the output terminal; if the input selection signal is a logic-level low, the first input terminal is connected to the output terminal.

The switches in the switch array SW0_1-SW2_1 are arranged in a cascading pyramid, such that a first row of switches SW0_1-SW0_4 includes $2^{n-1}$ switches, where n is the resolution in bits of the analog-to-digital pulse width modulation circuitry 36, a second row of switches SW1_1-SW1_2 includes $2^{n-2}$ switches, and so on, until the last row of switches in the switch array SW0_1-SW2_1 contains only one switch. Each one of the switches in the first row of switches SW0_1-SW0_4 is connected to the clock generator circuitry 40 such that each one of the input terminals of the switches is connected at the output of a different one of the plurality of delay taps TAP_1-TAP_HK. Accordingly, a different one of the plurality of delayed clock signals DEL_CLKS is presented to each input terminal of the first row of switches SW0_1-SW0_4. The input terminals of each switch in the first row of switches SW0_1-SW0_4 are arranged such that the first input terminal of each switch will receive a clock signal that is delayed in time less than the clock signal received by the second input terminal. Each one of the output terminals of each switch in the first row of switches SW0_1-SW0_4 is coupled to an input terminal of the second row of switches SW1_1-SW1_2, such that the first input terminal of each switch in the second row of switches SW1_1-SW1_2 will receive a clock signal from the first row of switches SW0_1-SW0_4 that is delayed in time less than the clock signal received by the second input terminal of each switch. This pattern continues until the last row of switches, which contains only one switch SW2_1. The last switch SW2_1 is coupled at the output terminal to the output stage 44, such that a single connection path in the switch array SW0_1-SW2_1 exists between the clock generator circuitry 40 and the output stage 44. As the orientation of the switches in the switch array SW0_1-SW2_1 changes based upon the input selection signal to each switch, the connection path also changes to present a different delayed clock signal SDEL_CLK to the output stage 44.

The control selection terminal of each switch in the switch array SW0_1-SW2_1 is coupled to the output of one of the plurality of comparators C1-C7 in the thermometer code generator circuitry 38, such that a single bit of the digital thermometer code T_CODE provides the input selection signal to one switch in the switch array SW0_1-SW2_1. The plurality of comparators C1-C7 are coupled to the control selection terminals of each one of the switches such that as the digital thermometer code T_CODE increases, the delay of the selected delayed clock signal SDEL_CLK presented to the output stage 44 also increases.

The output stage receives the reference clock signal REF_CLK from the clock generator circuitry 40 and the selected delayed clock signal SDEL_CLK from the delay selection circuitry 42. According to one embodiment, the output stage processes the signals using an exclusive-or function to generate the rectangular pulse signal V_PWM. However, any processing method to produce a rectangular pulse output signal from the reference clock signal REF_CLK and the selected delayed clock signal SDEL_CLK may be used according to the present disclosure.

Figure 8:
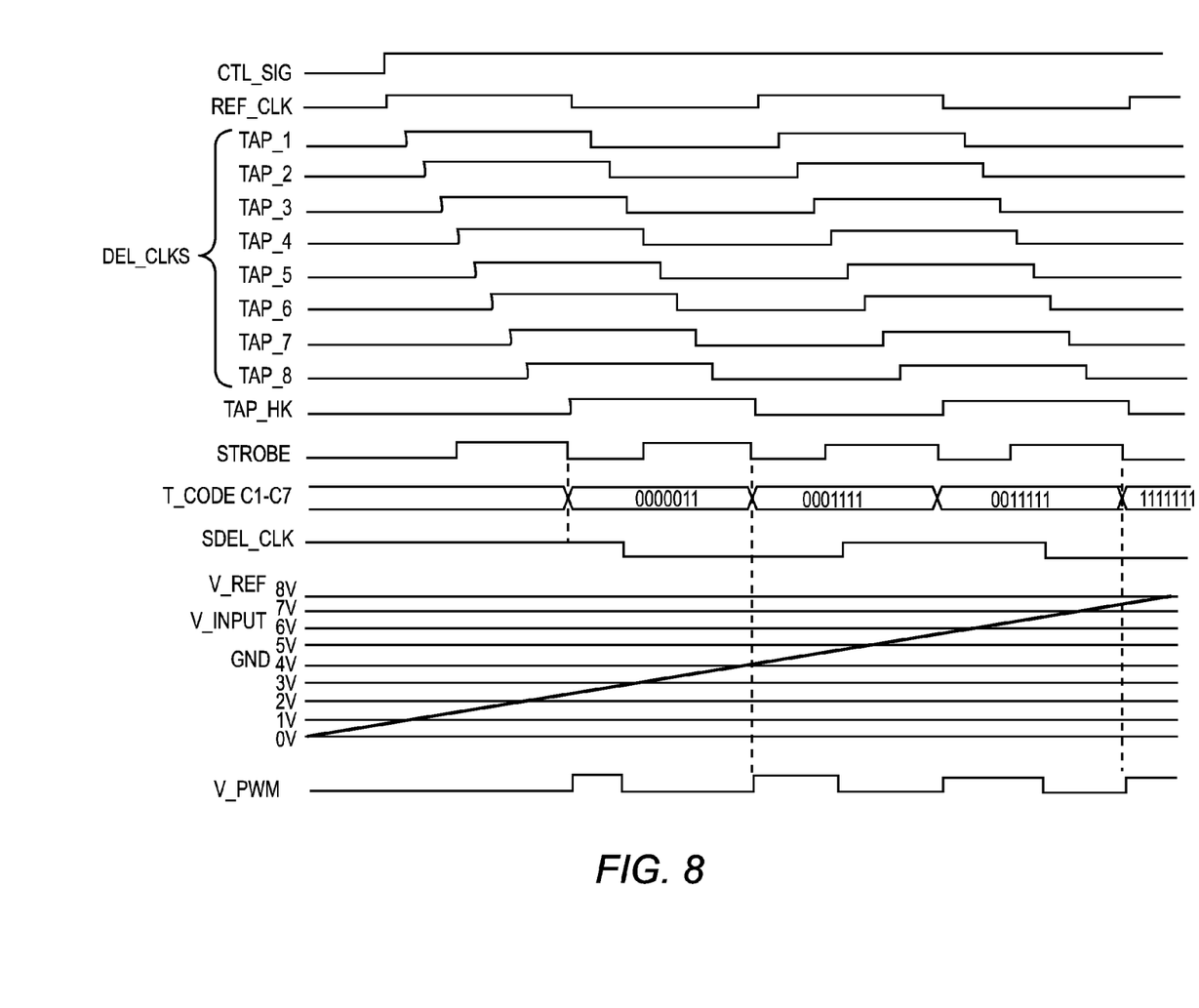
FIG. 8 is a timing diagram representing the operation of analog-to-digital pulse width modulation circuitry according to one embodiment of the present disclosure.

FIG. 8 is a timing diagram illustrating the operation of the analog-to-digital pulse width modulation circuitry 36 according to one embodiment of the present disclosure. As shown in the timing diagram, before the control signal CTL_SIG is switched to a logic-level high, the clock generator circuitry 40 remains off, and the analog-to-digital pulse width modulation circuitry 36 does not produce a pulse signal. When the control signal CTL_SIG is brought to a logic-level high, the clock generator circuitry 40 begins producing a reference clock signal REF_CLK, a plurality of delayed clock signals DEL_CLKS, and a strobe control signal STROBE, as discussed above. The strobe control signal STROBE is used to drive the plurality of comparators C1-C7 of the thermometer code generator circuitry 38 in order to generate a digital thermometer code T_CODE based upon the analog input voltage V_INPUT. The digital thermometer code T_CODE is used by the delay selection circuitry 42 to select a delayed clock signal SDEL_CLK, which is presented to the output stage 44 where it is used along with the reference clock signal REF_CLK to generate a rectangular pulse output signal V_PWM.

As an example, when the clock generator circuitry 40 is turned on by switching the control signal CTL_SIG to a logic-level high, the strobe control signal STROBE causes the plurality of comparators C1-C7 in the thermometer code generator circuitry 38 to sample the analog input voltage V_INPUT, which is around 2.5 volts according to the present example. Because the analog input voltage V_INPUT is higher than two out of seven of the plurality of comparators C1-C7, the digital thermometer code T_CODE will be "0000011". Accordingly, the second input terminals of the first switches in rows one and two SW0_1 and SW1_1 will be connected to their respective output terminals, while the first input terminals of all other switches will be coupled to their respective output terminals. Accordingly, a connection path is formed between the output of the third delay tap TAP_3 and the output stage 44. The output stage 44 uses the selected delayed clock signal SDEL_CLK at the output of the third delay tap TAP_3 and the reference clock signal REF_CLK to generate a rectangular pulse output signal V_PWM, for example, by application of an exclusive-or function to both of the signals. At the start of the next clock cycle, the thermometer code generator circuitry 38 will sample the analog input voltage V_INPUT again to generate an updated digital thermometer code T_CODE, and the process will be repeated.

Those skilled in the art will recognize improvements and modifications to the preferred embodiments of the present disclosure. All such improvements and modifications are considered within the scope of the concepts disclosed herein and the claims that follow.

What is claimed is:

1. Pulse width modulation circuitry comprising:
   thermometer code generator circuitry configured to produce a digital thermometer output code corresponding to a received analog input voltage;
   clock generator circuitry configured to generate a reference clock signal and a plurality of delayed clock signals;
   delay selection circuitry configured to select a delayed clock signal from the plurality of delayed clock signals based on the digital thermometer output code; and
   an output stage configured to generate a pulse width modulated output signal based upon the reference clock signal and the selected delayed clock signal.

2. The pulse width modulation circuitry of claim 1, wherein the thermometer code generator circuitry comprises:
   a plurality of resistors coupled in series between ground and a reference voltage and configured to divide the reference voltage into a plurality of discrete voltage levels; and
   a plurality of comparators, wherein each comparator is configured to compare one of the plurality of discrete voltage levels to the received analog input voltage and generate a digital output signal such that the output terminals of the plurality of comparators represent the digital thermometer code.

3. The pulse width modulation circuitry of claim 2, wherein each one of the plurality of comparators is configured to generate a logic-level high signal if the discrete voltage level associated with the comparator is less than the received analog input voltage and generate a logic-level low signal if the discrete voltage associated with the comparator level is greater than the received analog input voltage.

4. The pulse width modulation circuitry of claim 1, wherein the clock generator circuitry comprises a ring oscillator.

5. The pulse width modulation circuitry of claim 4, wherein the ring oscillator comprises a reference clock generator and a plurality of delay taps, wherein the plurality of delay taps are each configured to delay the reference clock signal by a predetermined amount of time to generate the plurality of delayed clock signals.

6. The pulse width modulation circuitry of claim 1, wherein the delay selection circuitry comprises a plurality of switches coupled between the thermometer code generator circuitry and the clock generator circuitry and configured to select a delayed clock signal from the plurality of delayed clock signals based upon the digital thermometer code and deliver the selected delayed clock signal to the output stage.

7. The pulse width modulation circuitry of claim 6, wherein each one of the plurality of switches includes a first input terminal, a second input terminal, and an output terminal and is controlled by a single bit of the digital thermometer code, such that if one of the plurality of switches receives a logic-level low signal, the switch will connect the first input terminal to the output terminal, and if the switch receives a logic-level high signal, the switch will connect the second input terminal to the output terminal.

8. The pulse width modulation circuitry of claim 7, wherein the plurality of switches are arranged in a cascading fashion such that as the digital thermometer code increases, the delay of the selected delayed clock signal with respect to the reference clock signal increases.

9. The pulse width modulation of claim 7, wherein the thermometer code generator circuitry comprises:
   a plurality of resistors coupled in series between ground and a reference voltage and configured to divide the reference voltage into a plurality of discrete voltage levels; and a plurality of comparators, wherein each comparator is configured to compare one of the plurality of discrete voltage levels to the received analog input voltage and generate a digital output signal such that the output terminals of the plurality of comparators represent the digital thermometer code.

10. The pulse width modulation circuitry of claim 9, wherein each one of the plurality of comparators is configured to generate a logic-level high signal if the discrete voltage level associated with the comparator is less than the received analog input voltage and generate a logic-level low signal if the discrete voltage level associated with the comparator is greater than the received analog input voltage.

11. The pulse width modulation circuitry of claim 10, wherein each one of the plurality of switches includes a control terminal coupled to the output of one of the plurality of comparators.

12. The pulse width modulation circuitry of claim 10, wherein the clock generator circuitry comprises a ring oscillator.

13. The pulse width modulation circuitry of claim 12, wherein the ring oscillator comprises a reference clock generator and a plurality of delay taps, wherein the plurality of delay taps are each configured to delay the reference clock signal by a predetermined amount of time to generate the plurality of delayed clock signals.

14. The pulse width modulation circuitry of claim 13, wherein each one of the plurality of delay taps of the ring oscillator is associated with an input terminal of one of the plurality of switches.

15. The pulse width modulation circuitry of claim 14, wherein the plurality of switches are arranged in a cascading fashion such that as the digital thermometer code increases, the delay of the selected delayed clock signal with respect to the reference clock signal increases.

16. The pulse width modulation circuitry of claim 1, wherein the output stage comprises an exclusive-or logic gate.

17. A method comprising:
  generating a digital thermometer code corresponding to a received analog input voltage;
  generating a reference clock signal and a plurality of delayed clock signals;
  selecting a delayed clock signal from the plurality of delayed clock signals based on the generated digital thermometer code; and
  generating a pulse width modulated output signal based upon the reference clock signal and the selected delayed clock signal.

18. The method of claim 17, wherein generating the pulse width modulated output signal based upon the reference clock signal and the selected delayed clock signal comprises comparing the reference clock signal and the selected delayed clock signal using an exclusive-or function.

19. The method of claim 17, wherein generating the digital thermometer code comprises:
  dividing a reference voltage into a plurality of discrete voltage levels;
  comparing each one of the discrete voltage levels to the received analog input voltage; and
  generating a logic-level high signal for each one of the discrete voltage levels that is lower than the received analog input voltage and generating a logic-level low signal for each one of the discrete voltage levels that is higher than the received analog input voltage.

* * * * *